United States Patent

Hsu et al.

[11] Patent Number: 5,910,673
[45] Date of Patent: Jun. 8, 1999

[54] LOCOS MOS DEVICE FOR ESD PROTECTION

[75] Inventors: Sheng Teng Hsu, Camas, Wash.; Katsumasa Fujii; Hidechika Kawazoe, both of Nara, Japan; Jong Jan Lee, Camas, Wash.

[73] Assignees: Sharp Microelectronics Technology, Inc., Camas, Wash.; Sharp Kabushiki Kaisha, Osaka, Japan

[21] Appl. No.: 08/984,801

[22] Filed: Dec. 4, 1997

[51] Int. Cl.[6] .................................................. H01L 23/62
[52] U.S. Cl. ........................ 257/355; 257/356; 257/357; 257/358; 257/361; 257/362
[58] Field of Search .................................. 257/355, 356, 257/360, 357, 358, 361, 362; 438/133, 564, 154, 405, 237, 981

[56] References Cited

U.S. PATENT DOCUMENTS

| | | |
|---|---|---|
| 5,545,909 | 8/1996 | Williams et al. ................... 257/355 |
| 5,559,352 | 9/1996 | Hsue et al. ......................... 257/328 |
| 5,654,574 | 8/1997 | Williams et al. ................... 257/355 |
| 5,670,814 | 9/1997 | Wu et al. ........................... 257/360 |
| 5,705,841 | 1/1998 | Yu ..................................... 257/355 |
| 5,773,326 | 6/1998 | Gilbert et al. ..................... 438/154 |
| 5,777,368 | 7/1998 | Wu et al. ........................... 257/360 |
| 5,856,214 | 1/1999 | Yu ..................................... 438/133 |

*Primary Examiner*—Carl Whitehead, Jr.
*Attorney, Agent, or Firm*—Gerald Maliszewski; David C. Ripma

[57] ABSTRACT

A MOS transistor having a multilevel gate oxide layer is provided for use in an ESD protection circuit. A thick gate oxide layer near the drain insures that the transistor has a relatively large drain to gate breakdown voltage. A thin gate oxide layer near the source permits the gate voltage to turn the transistor on and off with rapid switching speeds. The thick portion of the MOS transistor multilevel gate oxide layer is formed with a local oxidation of silicon (LOCOS) process, while the thin gate layer is formed in a separate step. An ESD protection circuit and method for fabricating the above-mentioned multilevel gate oxide layer MOS transistor are also provided.

11 Claims, 6 Drawing Sheets

LOCOS MOS DEVICE FOR ESD PROTECTION

BACKGROUND AND SUMMARY OF THE INVENTION

This invention relates generally to semiconductor technology and, more specifically, to a gate oxide formed through local oxidation of silicon (LOCOS) to provide a MOS transistors with a large drain to gate breakdown voltage for electrostatic discharge (ESD) protection.

MOS technology, especially submicron CMOS integrated circuits (ICs), is susceptible to damage due electrostatic discharge at the input ports of the devices. A charge generating a 4000 volt pulse for a period of several nanoseconds is sufficient to damage a typical MOS device. Such a charge is easily accumulated on the human body in ordinary conditions. Voltage pulses of even 100 volts have been known to damage circuits. These gate voltages generate large electric fields between the gate and channel region underlying the gate. The intervening thin layer of gate oxide is often damaged from the resulting "punch-through" effect. As a result of the susceptibility of these devices to ESD, many MOS devices incorporate protection features.

A variety of ESD protection schemes have been used to protect MOS input ports. FIG. 1 illustrates an electrical circuit 10 including an input port 12 operatively connected to a MOS transistor 14 through an ESD protection circuit (prior art). The ESD protection circuit consists of a series current limiting element 16 and a network of shunt voltage clamps 18, 20, 22, and 24. Series resistors have been used for current limiting element 16. Diodes and silicon controlled rectifiers (SCRs) have been used for voltage clamps 18, 20, 22, and 24. Series resistor 16 de-couples the voltage seen at port 12 from the gate (g) of transistor 14. Diodes and SCRs 18, 20, 22, and 24, on either end of series resistor 16 tend to clamp the node voltage to a maximum level. However, the time constants associated with elements 16, 18, 20, 22, and 24 reduce the signal speed of intended signals and limit the reaction time of the protection circuits.

The simplest shunt circuit for ESD protection would be a single MOS transistor. However, to effectively discharge ESD input charges, such a device would have to exhibit a larger than normal drain to gate breakdown voltage and low drain breakdown voltage. In addition, the device would have a large threshold voltage and low parasitic capacitance, so that under normal conditions, the protection transistor does not add significant propagation delays to an intended incoming signal. SCRs typically turn on at relatively large voltages with relatively long delays. Therefore, an SCR cannot be used to protect sub-micron CMOS circuits without additional bias circuitry. An SCR that turns on at low trigger voltages is fairly complex circuit that is cumbersome to fabricate.

It would be advantageous if a simple voltage clamp, having a single channel area, could be developed to simplify fabrication and minimize the number of RC time constants. Further, it would be advantageous if an MOS transistor could be used to protect the input port of an MOS IC from ESD.

It would be advantageous if the drain to gate breakdown voltage of a MOS transistor could be increased for use as an ESD protection voltage clamp. Further, it would be advantageous the drain to gate breakdown voltage of a MOS transistor could be increased for ESD protection without increasing the drain voltage characteristics for all the MOS transistors in the IC.

It would be advantageous if the drain to gate breakdown voltage of a MOS transistor could be increased for use as a shunt voltage clamp for ESD protection without slowing the switching speed of the transistor.

Accordingly, a MOS device, having a large drain to gate breakdown voltage for ESD protection, selected from the group consisting of NMOS and PMOS transistors, is provided. The MOS device comprises source and drain regions of doped silicon, formed in a doped silicon well. The MOS device further comprises a local area of oxidized silicon (LOCOS) overlying the doped silicon well to form a thick region of gate oxide adjoining the drain. The LOCOS area has a thickness in the range between 2000 and 5000 Å, and the length of the LOCOS area is less than approximately 1 micron. A thin area of oxide overlies the doped silicon well forming a thin region of gate oxide adjoining the source. The thin gate oxide thickness is dependent upon the dielectric constant of the gate oxide material, the gate oxide thickness increasing as the dielectric constant increases. As a basis for comparison, when the gate oxide is thermally grown silicon oxide, then the gate oxide thickness is less than approximately 20 nanometers.

Further, a doped gate electrode partially overlies the thin gate oxide, and partially overlies the thick LOCOS gate oxide regions. The above-mentioned transistor has a large drain to gate breakdown due to the large region of oxide separating the drain from the gate. The ESD event turn-on time is short, comparable to a state of the art thin gate oxide transistor, because to electric field in the channel area next to the source is still susceptible to small changes in gate voltage.

The MOS device also comprises gate sidewalls made from either oxide or nitride, adjoining the gate electrode, and a dielectric interlevel made from oxide or TEOS overlying the gate, source, and drain. Contact holes through the dielectric interlevel access the gate, source, and drain regions, and metal in the contact holes forms metal connections to the gate, source, and drain. The metal connections electrically interface to the active areas of the MOS transistor in preparation for connections to other metal levels in the MOS device.

When the LOCOS device is NMOS, the silicon well is p doped, the source and drain are n+ doped, and the gate electrode is n+ doped. When the LOCOS device is PMOS, the silicon well is n doped, the source and drain are p+ doped, and the gate electrode is either p+ or n+ doped, although a p+ doped gate is more typical.

In the fabrication of a MOS device for ESD protection, selected from the group consisting of NMOS and PMOS transistors, a method for forming a LOCOS transistor with a large drain to gate breakdown voltage is also provided. The method comprises the steps of:

a) forming a well of silicon including a first dopant, from which source and drain regions are subsequently formed;

b) forming a localized area of oxidized silicon (LOCOS) having a first thickness;

c) depositing a thin layer of gate oxide having a second thickness overlying the doped silicon well and the LOCOS area; and d) depositing, patterning, and doping, with a second dopant, a layer of polysilicon overlying a portion of the LOCOS area and an adjoining area of thin oxide, to form a gate electrode having a gate electrode length. The gate electrode is formed over both thin and thick areas of gate oxide.

The two-level gate oxide level formed through LOCOS permits the associated MOS transistor to develop higher than normal voltages on the drain before gate oxide breakdown occurs. Once the drain breakdown occurs, the parasitic bipolar transistor effect completes the turn-on of the MOS transistor, so that a low resistance between the drain and source results, and large currents are conducted. Such a device is ideally suited as a voltage clamp, since the low resistance and high current carrying capabilities of the device act to reduce the peak electrical charges at the drain. In this manner, circuitry connected to the drain of the LOCOS MOS transistor is protected from large energy spikes.

DETAILED DESCRIPTION OF THE PREFERRED EMBODIMENT

Figure 1:
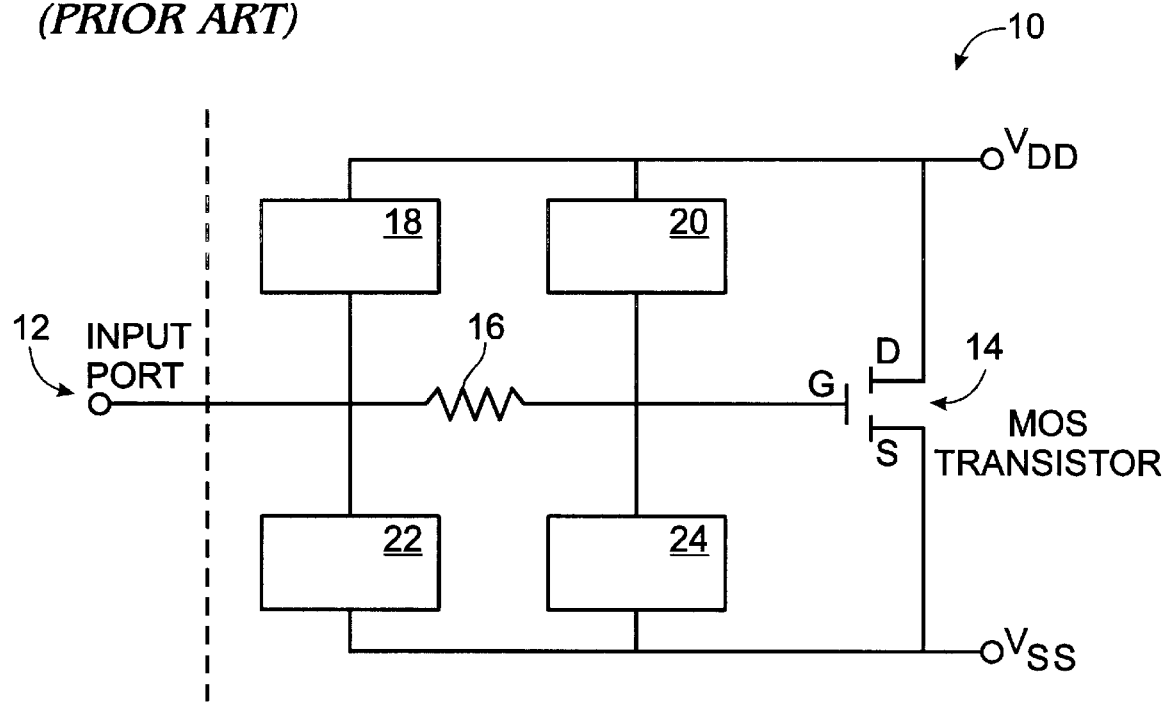
FIG. 1 illustrates an electrical circuit including an input port operatively connected to a MOS transistor through an ESD protection circuit (prior art).
Figure 2:
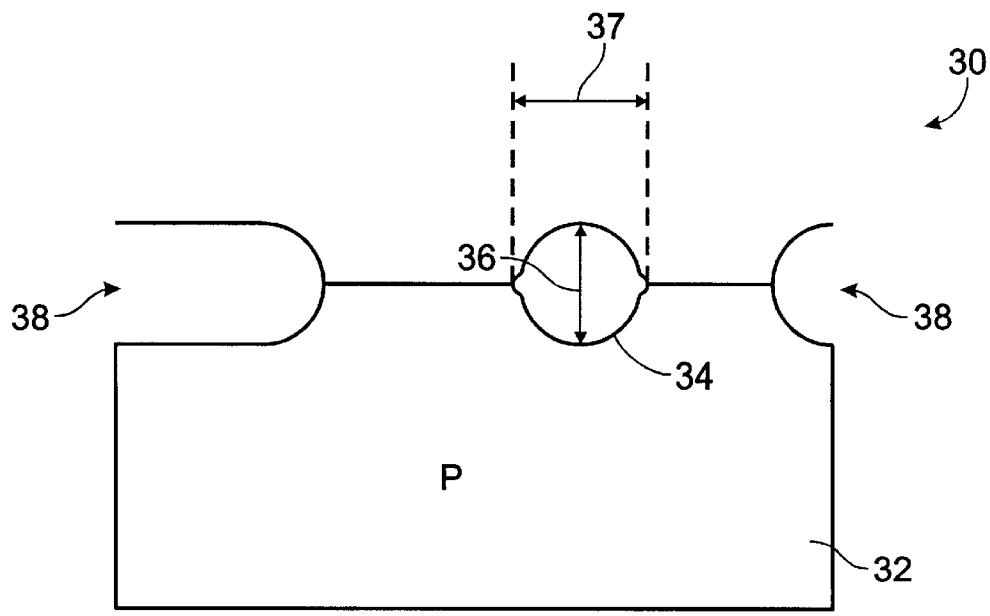
FIGS. 2 through 10 illustrate steps in the completion of the LOCOS MOS device of the present invention, having a large drain to gate breakdown voltage for ESD protection.

FIGS. 2 through 10 illustrate steps in the completion of the LOCOS MOS device of the present invention, having a large drain to gate breakdown voltage for ESD protection. FIG. 2 is a partial cross-sectional view of a MOS device 30, selected from the group consisting of NMOS and PMOS transistors. For the purpose of brevity, only an NMOS device is depicted in FIGS. 2 through 10. An explanation of a corresponding PMOS device appears in the text, below, with the description of the NMOS device. MOS device 30 comprises a well of doped silicon 32. When LOCOS transistor 30 is an NMOS device, as shown in FIG. 2, silicon well 32 is p doped. Boron is a known dopant material. Alternately, when LOCOS transistor 30 is an PMOS device (not shown), silicon well 32 is n doped. Phosphorus and arsenic are typically used as the dopant for this task.

A local area of oxidized silicon (LOCOS) 34, having a first thickness 36, overlies doped silicon well 32 and forms a thick region of gate oxide adjoining the subsequently formed drain (not shown). LOCOS area first thickness 36 is in the range between 2000 and 5000 Å, and LOCOS area length 37 is less than approximately 1 micron. Areas of field oxide 38 adjoin MOS device 30 and isolate device 30 from the active regions of nearby CMOS devices. In some aspects of the invention, such as when neighboring devices (not shown) in the IC are fabricated with submicron technology, doped silicon well 32 is formed on a doped silicon substrate (not shown).

Figure 3:
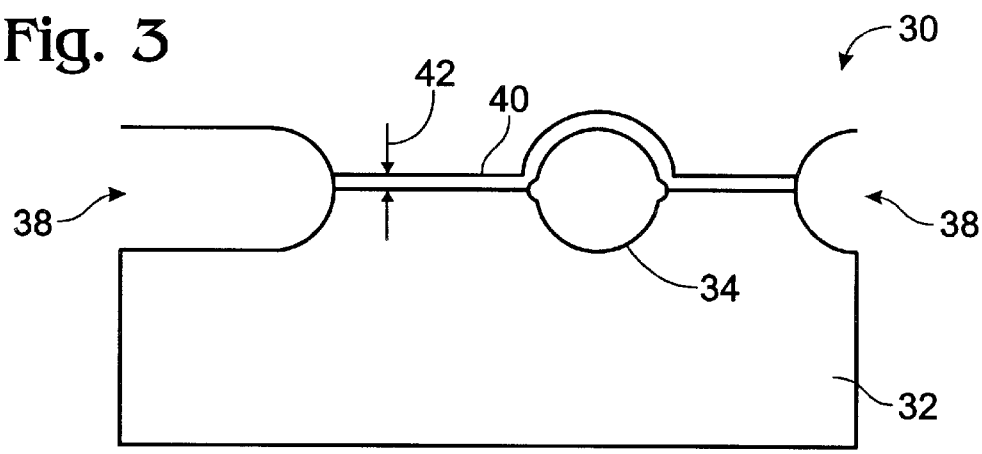

FIG. 3 is a partial cross-sectional view of MOS device 30 of FIG. 2 with a thin oxide layer 40, having a second thickness 42, overlying doped silicon well 32. A portion thin oxide layer 40 forms a thin region of gate oxide adjoining the source (not shown). Thin gate oxide second thickness 42 is approximately the same thickness as the gate oxide in typical MOS transistors elsewhere in the IC (not shown). Specifically, thickness 42 varies in response to IC technology and the dielectric constant of the material used to fabricate oxide layer 40. When oxide layer 40 is thermally grown silicon oxide, with a relative dielectric constant of 3.9, thickness 42 is less than approximately 20 nanometers (nm). Using the relationship between the dielectric constant and the thickness expressed above, the larger thicknesses required for materials with higher dielectric constants is calculated. That is, gate oxide second thickness 42 varies in response to the dielectric constant of gate oxide material 40, and corresponds to an equivalent thickness of less than approximately 20 nm, when said thin gate oxide is thermally grown silicon oxide. Because oxide layer 40 is so thin compared to LOCOS area 34, it is not shown as a distinct layer when overlying LOCOS area 34 in FIGS. 4–10.

Figure 4:
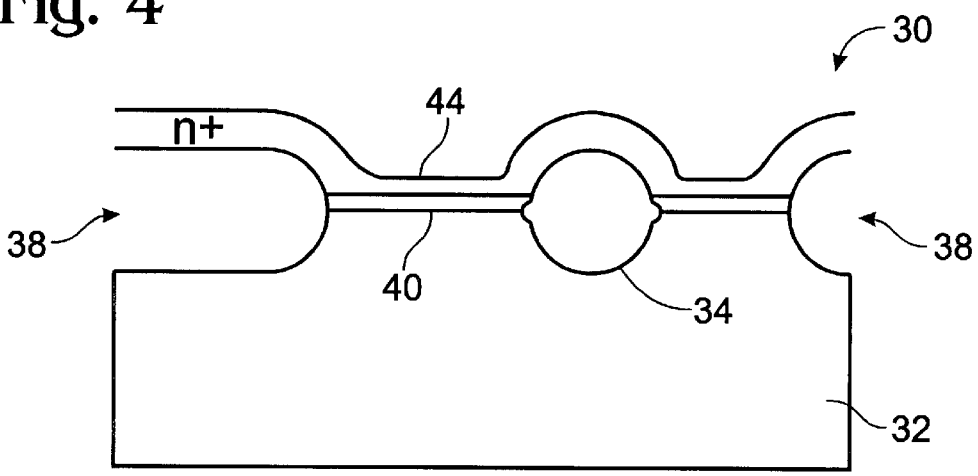

FIG. 4 is a partial cross-sectional view of MOS device 30 of FIG. 3 with a gate electrode material 44 overlying oxides areas 34 and 40. Gate electrode material 44 is selected from the group consisting of polysilicon and polycide.

Figure 5:
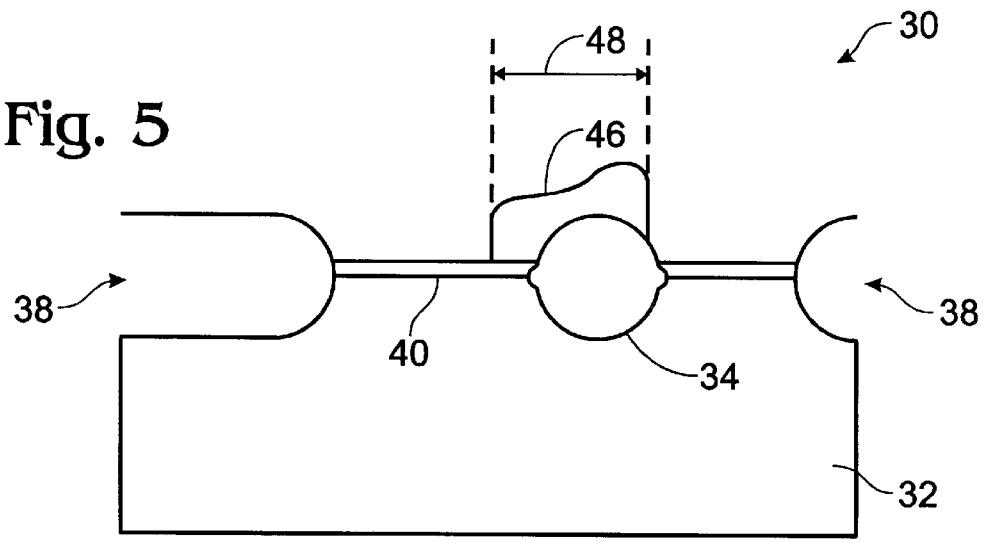

FIG. 5 is a partial cross-sectional view of MOS device 30 of FIG. 4 after a step of masking and etching gate electrode material 44 to form a doped gate electrode 46 having a length 48 partially overlying thin gate oxide 40, and partially overlying thick LOCOS gate oxide 34 regions.

Figure 6:
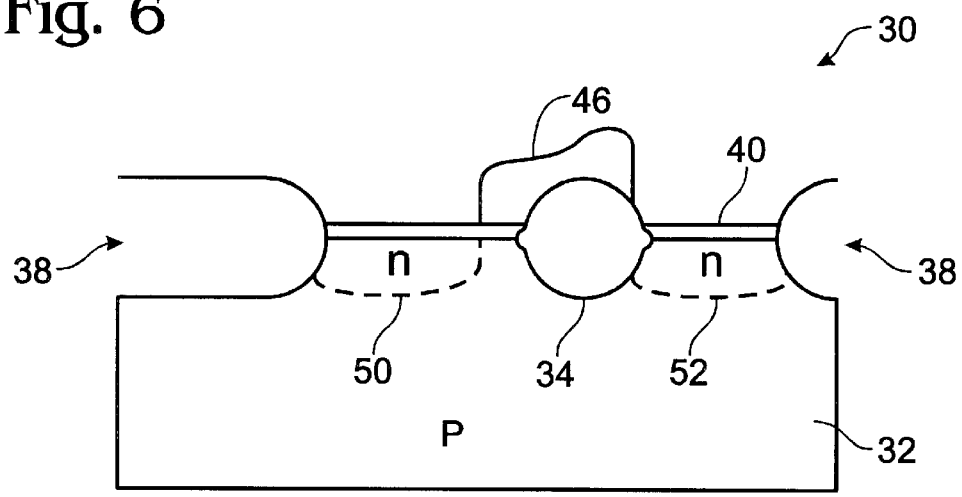

FIG. 6 is a partial cross-sectional view of MOS device 30 of FIG. 5 after light density doping (LDD) areas 50 and 52 in silicon well 32 adjoining gate electrode 46, in the preparation of source and drain regions. When MOS device 30 is NMOS, silicon well 32 is doped with p material, as shown in FIG. 6. The LDD is typically performed with a dopant selected from the group consisting of phosphorus or arsenic. Alternately, when MOS device 30 is PMOS, silicon well 32 is doped with n material (not shown). Then, the dopant is boron or $BF_2$.

Figure 7:
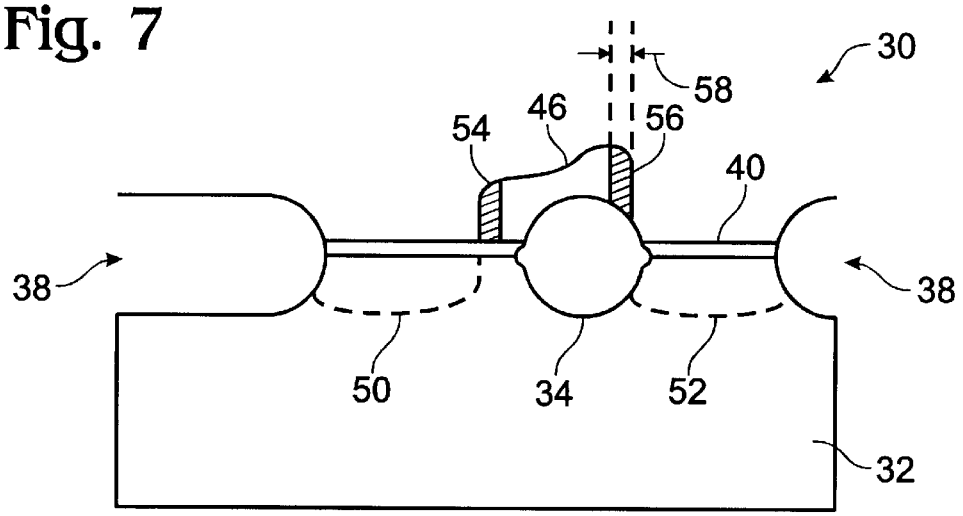

FIG. 7 is a partial cross-sectional view of MOS device 30 of FIG. 6 after the formation of gate sidewalls 54 and 56 having a third thickness 58 adjoining gate electrode 46. Gate sidewall third thickness 58 is in the range between 50 and 200 nanometers (nm). Sidewalls 54 and 56 act as insulators between gate electrode 46 and subsequently formed source/drain regions (not shown). The material for gate sidewalls 54 and 56 is selected from the group consisting of oxide and nitride.

Figure 8:
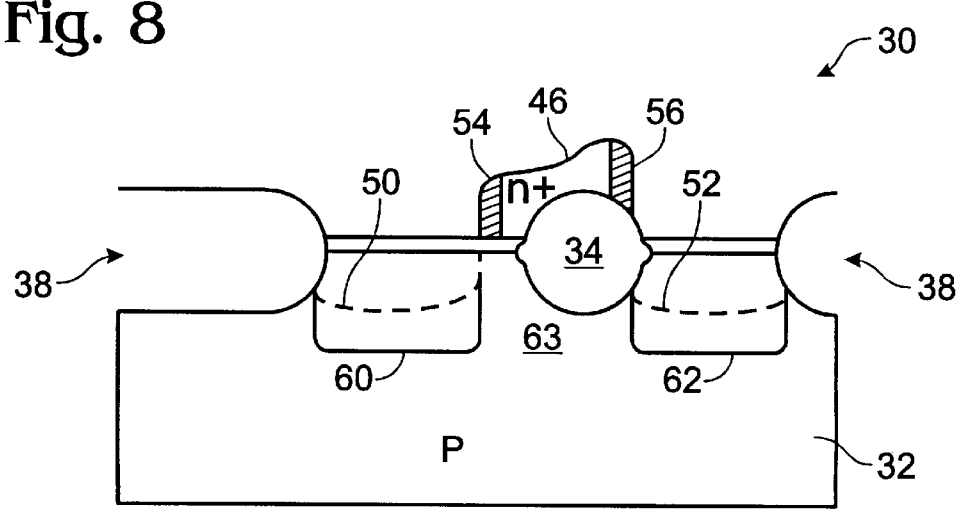

FIG. 8 is a partial cross-sectional view of MOS device 30 of FIG. 7 with source 60 and drain 62 regions of doped silicon formed in doped silicon well 32. When LOCOS transistor 30 is NMOS, silicon well 32 is p doped, source 60 and drain 62 are n+ doped, and gate electrode 46 is n+ doped. Typically, the dopant is phosphorus or arsenic. Alternately, when LOCOS transistor 30 is PMOS (not shown), silicon well 32 is n doped, source 60 and drain 62 are p+ doped, and gate electrode 46 is doped with a material selected from the group consisting of p+ and n+ type dopants. Boron and $BF_2$ are often used as dopants. Typically, PMOS transistor 30 has a p+ doped gate electrode 46. Because of the large first thickness 36 of oxide (see FIG. 2) between gate electrode 46 and drain 62, and the thin second thickness 42 (see FIG. 3) between gate electrode 46 and source 60, a large voltage is applied to the drain without a gate oxide breakdown. The ESD drain current, however, is controlled through fields in channel region 63, underlying thin gate oxide layer 40, so that small changes in gate voltage and short delays are associated with ESD event turn-on of device 30.

Figure 9:
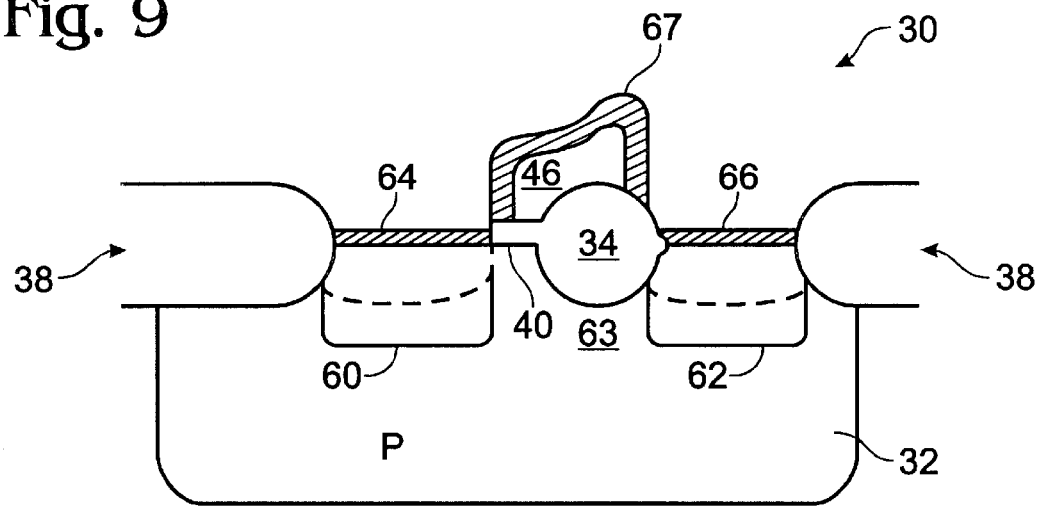

FIG. 9 is a partial cross-sectional view of MOS device 30 of FIG. 8 following the salicide step. In some aspects of the invention, layers of silicide 64 and 66 overlie, respectively, source 60 and drain 62 regions to improve the electrical interface between source/drain regions 60 and 62 and a subsequently formed metal connection (not shown). In some aspects of the invention, a layer of silicide 67 overlies gate electrode 46.

Figure 10:
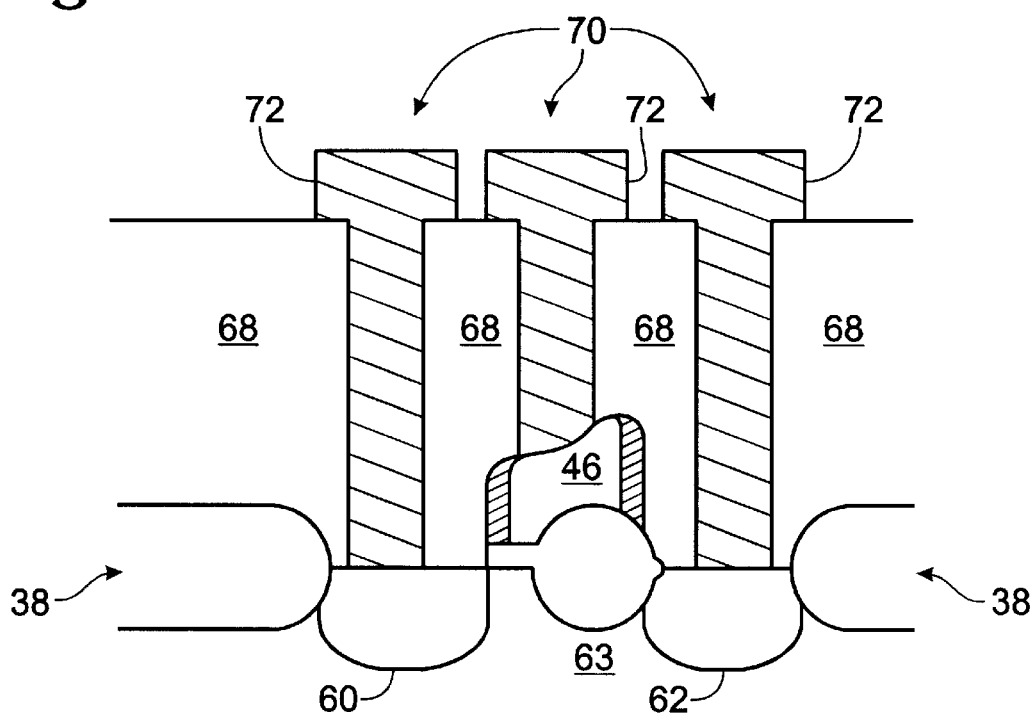

FIG. 10 is a partial cross-sectional view of MOS device 30 of FIG. 9 following the formation of a dielectric interlevel 68 selected from the group consisting of oxide and TEOS overlying gate 46, source 60, and drain 62. Contact holes 70 through dielectric interlevel 68 access gate 46, source 60, and drain 62 regions. Metal 72 in contact holes 70 form metal connections to gate 46, source 60, and drain 62. In this manner, electrical connections are made to active areas 46, 60, and 62 of MOS transistor 30 to interface with other metal levels (not shown), subsequently fabricated in the MOS device.

A summary of the operation of MOS transistor 30 is presented below. Transistor 30 has two thickness, 36 and 42, of gate oxide. First thickness 36 is more than two orders of magnitude greater than second thickness 42. LOCOS oxide layer 34 acts as an insulator to reduce the electric field gate oxide 34 when a large ESD pulse appears at drain electrode 62. In the normal operating conditions, when voltages on drain 62 and gate 46 are at intended signal levels, thick oxide layer 34 prevents device 30 from turning on, and the device remains off despite fluctuations in voltage associated with supply voltages and normal amplitude signals. When an ESD pulse appears at drain 62, charges in the silicon channel region 63, underlying LOCOS gate area 34, are depleted. The gate voltage, through second gate oxide thickness 42, controls the current of device 30. The current in channel 63 triggers the drain junction to breakdown. The result is that a parasitic bipolar transistor (not shown) is effectively formed in silicon well 32, with source 60 acting as emitter, silicon well 32 the base, and drain 62 as the collector. With the triggering of channel current, parasitic transistor is turned on by the drain junction breakdown current. Very large amounts of current flow through the parasitic bipolar transistor when it is enabled. Therefore, it is able to absorb a large amount of ESD charge at drain 62 without a breakdown in thin gate oxide 40.

Figure 11:
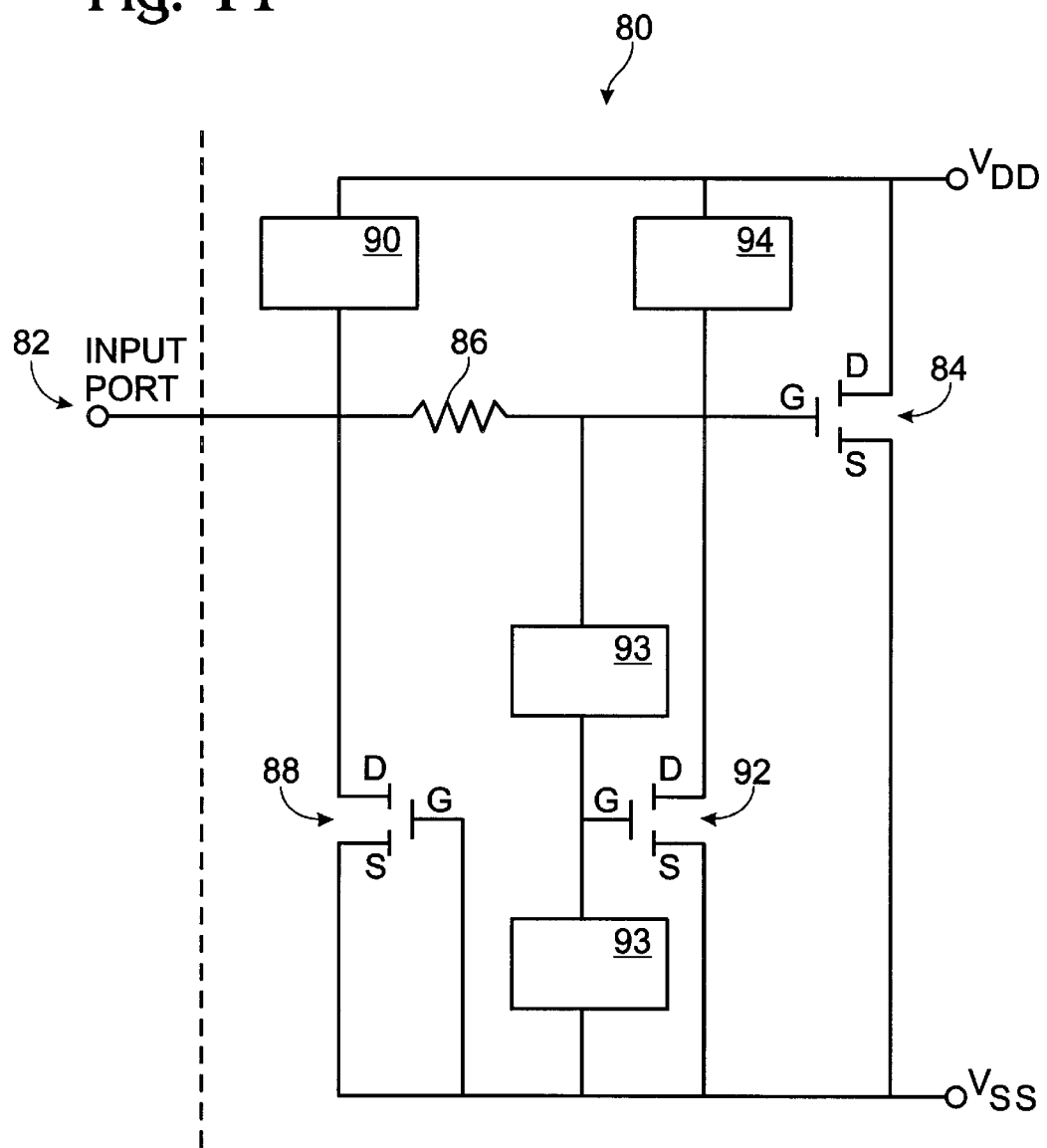
FIG. 11 illustrates an ESD protection circuit using a LOCOS MOS transistor of the present invention as a voltage clamp.

FIG. 11 illustrates an ESD protection circuit using a LOCOS MOS transistor of the present invention as a voltage clamp. An ESD protection circuit 80 is located between an input port 82 and an electrical device 84. Electrical device 84 is shown as a FET, although protection circuit 80 is suitable for the protection of many electrical devices. ESD protection circuit 80 protects the input of electrical device 84 from large voltage pulses. ESD circuit 80 comprises at least one current limiting element 86 in series between input port 82 and the input of electrical device to be protected 84. Typically current limiting element 86 is a resistor, although other passive and active electrical components are also suitable to provide resistance between input port 82 and electrical device 84.

ESD circuit 80 also comprises at least a first LOCOS MOS device 88 connected in shunt from input port 82. A NMOS LOCOS device 88 is shown operatively connecting input port 82 to the $V_{SS}$ voltage, which is often ground. LOCOS device 88 clamps an input voltage, introduced at input port 82, to a maximum level. The maximum level corresponds with the drain, or drain to source breakdown voltage of LOCOS transistor 88, as explained above in the description of FIGS. 2–10. First LOCOS MOS device 88 includes a multilevel gate oxide layer (see FIGS. 2–10) with a thin layer of gate oxide adjoining a source, and a thick gate oxide layer, formed through LOCOS, adjoining a drain. First transistor 88 has a larger drain to gate breakdown voltage compared to standard MOS transistors and rapid ESD event switching speeds to conduct drain current. Alternately, first LOCOS MOS transistor is a PMOS device in the position of voltage clamp element 90, with element 88 being a prior art voltage clamp. In another alternative, voltage clamp 88 is not present with PMOS LOCOS device 90. PMOS LOCOS device 90 has a drain connected to input port 82, and the source and gate connected to $V_{DD}$. Further, NMOS LOCOS device 88 is used with PMOS LOCOS device 90 is some embodiments of the invention.

At least a second LOCOS MOS device 92 is connected in shunt from the input of electrical device to be protected 84. An NMOS LOCOS device 92 is shown with the drain operatively connected to the gate of FET 84, and the source to $V_{SS}$. Since elements 86 and 88 reduce voltages introduced at port 82, MOS device 92 must be turned on at lower drain voltages than MOS device 88. Bias devices 93, typically resistors, are often used to apply a voltage to the gate of transistor 92 to turn transistor 92 on at lower drain voltages. In some aspects of the invention, LOCOS device 88 is also biased with elements similar to bias devices 93, to enable the ESD devices at lower ESD voltage levels. As explained above with regard to device 88, MOS device 92 clamps voltage to a maximum voltage level, although the maximum level assigned to device 92 is typically lower to protect MOS transistor 84. Second LOCOS MOS device 92 includes a multilevel gate oxide layer (see FIGS. 2–10) with a thin layer of gate oxide adjoining a source, and a thick gate oxide layer, formed through LOCOS, adjoining a drain. In some aspects of the invention, voltage clamp element 94 is a PMOS device, connected as PMOS LOCOS device 90 with additional bias elements, such as bias elements 93 used with device 92. Alternately, device 92 is an NMOS LOCOS transistor and device 94 is a PMOS LOCOS transistor. Electrical device 80 is protected by multiple stages of voltage conditioning for protection from ESD.

Figure 12:
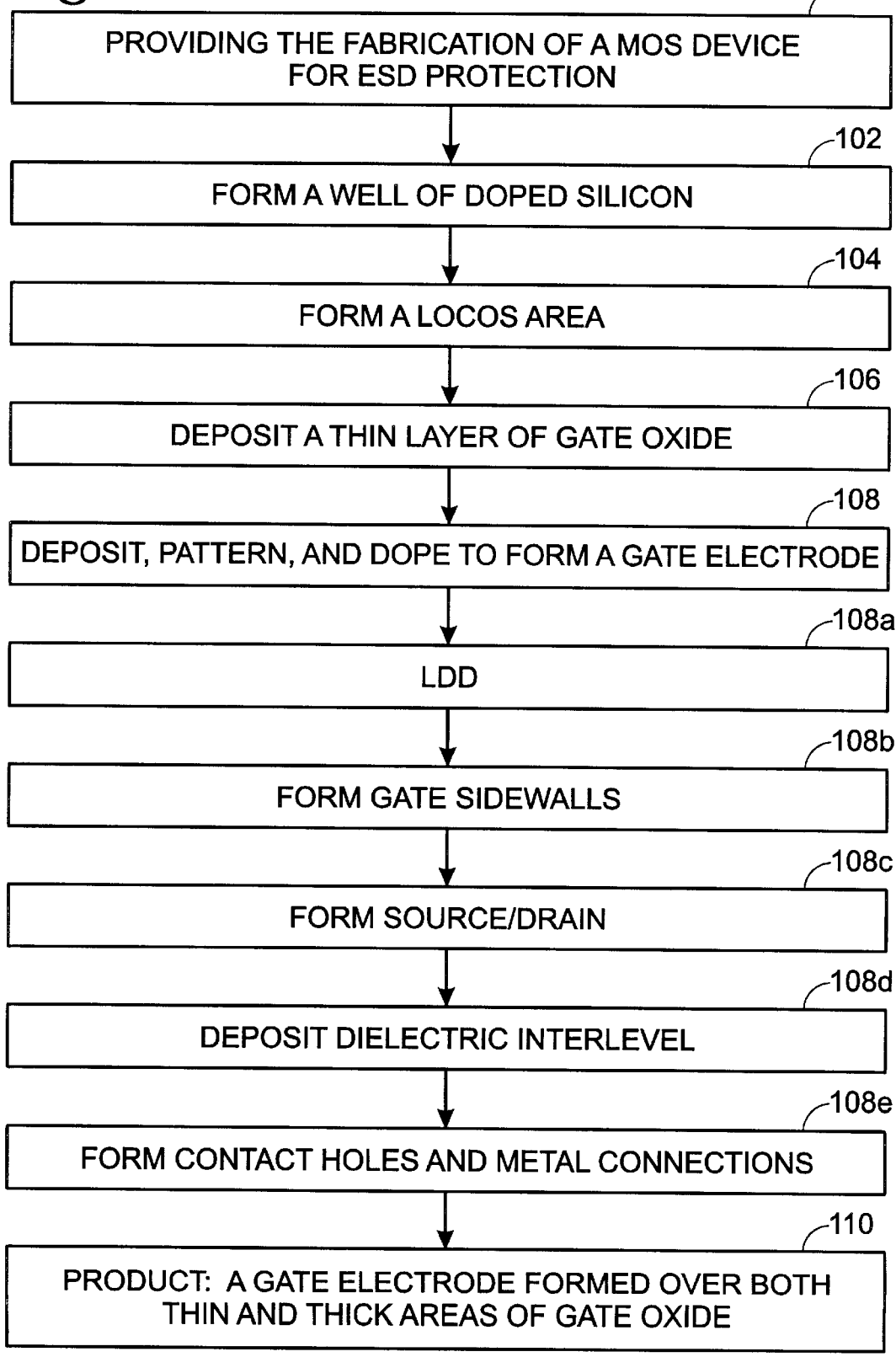
FIG. 12 is a flow chart illustrating a method for forming a LOCOS transistor with a large drain to gate breakdown voltage.

FIG. 12 is a flow chart illustrating a method for forming a LOCOS transistor with a large drain to gate breakdown voltage. Step 100 provides for the fabrication of a MOS device for ESD protection, selected from the group consisting of NMOS and PMOS transistors. Step 102 forms a well of silicon including a first dopant, from which source and drain regions are subsequently formed. Step 104 forms a localized area of oxidized silicon (LOCOS) having a length and a first thickness overlying the doped silicon well. The LOCOS area first thickness is in the range between 2000 and 5000 Å, when the LOCOS length is less than approximately 1 micron. Step 106 deposits a thin layer of gate oxide having a second thickness overlying the doped silicon well and the LOCOS area. The oxide second thickness is less than approximately 20 nm, when the thin gate oxide is a thermally grown silicon oxide. The second thickness increases proportionally with the use of material having higher dielectric constants than silicon oxide. Step 108 deposits, patterns, and dopes with a second dopant, a layer of polysilicon overlying a portion of the LOCOS area and the adjoining area of thin oxide, forming a gate electrode having a gate electrode length. Step 110 is a product, a gate electrode formed over both thin and thick areas of gate oxide.

Further steps follow Step 108. Step 108a light density dopes (LDD), with a third dopant, areas of the silicon well to begin the formation of source and drain regions. In some aspects of the invention, Step 108a includes doping the silicon well around the gate electrode with a HALO technique, where ions of dopant are implanted at a large tilted angle into the channel region underlying the gate electrode. Step 108b deposits and patterns material having a third thickness selected from the group consisting of oxide and nitride, to form gate sidewalls. The sidewall material third thickness is in the range between 50 and 200 nanometers (nm). Step 108c implants the source and drain regions with a fourth dopant to complete the formation of a source region adjoining the thin area of gate oxide, and a drain region adjoining the LOCOS area of gate oxide. In this manner, a transistor having a very large drain to gate breakdown voltage is formed.

Step 108d deposits an insulator, selected from the group consisting of oxide and TEOS, overlying the MOS transistor formed in Steps 100–108c. Step 108e patterns the insulator deposited in Step 108d to form contact holes to the gate, source, and drain regions. This step also deposits metal in the contact holes to form metal connections to the gate, source, and drain. Electrical connections are made to the active areas of the MOS transistor to interface with other metal levels of the MOS device formed in subsequent fabrication steps (not shown).

In some aspects of the invention, a further step (not shown) follows Step 108, and precedes Step 108a. This step forms a layer of silicide overlying the source and drain regions, whereby the electrical interface between the source/drain regions and subsequently deposited metal connection is improved.

When the LOCOS transistor is an NMOS device, Step 102 includes a p type first dopant, Step 108 includes an n+ type second dopant, Step 108a includes an n type third dopant, and Step 108c includes an n+ type fourth dopant. Alternately, when the LOCOS transistor is an PMOS device, Step 102 includes an n type first dopant, Step 108 includes a dopant selected from the group consisting of p+ and n+ types, Step 108a includes a p type third dopant, and Step 108c includes a p+ type fourth dopant.

The present invention provides a MOS transistor with a large drain to gate breakdown voltage. The gate oxide of this device is thinner at the source side, and thicker at the drain. When an ESD event occurs at the drain electrode, surface charges under the thick gate oxide are depleted. The gate voltage is able to effectively control the channel current. The parasitic bipolar transistor effectively formed in the MOS device is turned on when large amounts of current are conducted between the source and drain. The parasitic bipolar transistor is easily controlled by the gate voltage, so that the MOS device turns on without significant time delays. Thus, the MOS device is able to discharge a large amount of ESD charge at a relatively low drain voltage, effectively protecting the thin gate oxide regions of the IC from damage. During normal operation, the ESD protection device is in the off state. The MOS ESD protection device exhibits low parasitic capacitance and very low leakage current. Other embodiments of the present invention will occur to those skilled in the art.

What is claimed is:

1. A LOCOS MOS device, having a large drain to gate breakdown voltage for ESD protection, selected from the group consisting of NMOS and PMOS transistors, the MOS device comprising:

a well of doped silicon;

source and drain regions of doped silicon formed in said doped silicon well;

a local area of oxidized silicon (LOCOS), having a first thickness, overlying said doped silicon well and forming a thick region of gate oxide adjoining said drain;

a thin oxide layer, having a second thickness, overlying said doped silicon well and forming a thin region of gate oxide adjoining said source; and a doped gate electrode having a length partially overlying said thin gate oxide, and partially overlying said thick LOCOS gate oxide regions, whereby the transistor has a large drain to gate breakdown voltage and a short ESD event turn-on time.

2. A MOS device as in claim 1 comprising:

gate sidewalls having a third thickness, selected from the group of materials consisting of oxide and nitride, adjoining said gate electrode;

a dielectric interlevel selected from the group consisting of oxide and TEOS overlying said gate, source, and drain;

contact holes through said dielectric interlevel to access said gate, source, and drain regions; and metal in said contact holes to form metal connections to said gate, source, and drain, whereby electrical connections are made to said active areas of the MOS transistor to interface with other metal levels in the MOS device.

3. A MOS device as in claim 2 further comprising a layer of silicide overlying said source and drain regions, whereby the electrical interface between said source/drain regions and said metal connection is improved.

4. A MOS device as in claim 1 in which said LOCOS area has a length of less than approximately 1 micron and the first thickness is in the range between 2000 and 5000 Å.

5. A MOS device as in claim 1 in which said thin gate oxide second thickness varies in response to said gate oxide material, and corresponds to an equivalent thickness of less than approximately 20 nanometers (nm), when said thin gate oxide is thermally grown silicon oxide.

6. A MOS device as in claim 3 in which said gate sidewall third thickness is in the range between 50 and 200 nanometers (nm).

7. A MOS device as in claim 1 in which said doped silicon well is formed on a doped silicon substrate.

8. A MOS device as in claim 1 wherein the LOCOS transistor is an NMOS device, in which said silicon well is p doped, in which said source and drain are n+ doped, and in which said gate electrode is n+ doped.

9. A MOS device as in claim 1 wherein the LOCOS transistor is a PMOS device, in which said silicon well is n doped, in which said source and drain are p+ doped, and in which said gate electrode is doped with a material selected from the group consisting of p+ and n+ type dopants.

10. A MOS device as in claim 1 in which said gate electrode material is selected from the group consisting of polysilicon and polycide.

11. An ESD protection circuit located between an input port and an electrical device, for protecting the input of an electrical device from large voltage pulses, the ESD circuit comprising:

at least one current limiting element in series between the input port and the input of the electrical device to be protected;

at least a first LOCOS MOS device connected in shunt from the input port for clamping an input voltage, said first LOCOS MOS device including a multilevel gate oxide layer with a thin layer of gate oxide adjoining a source, and a thick gate oxide layer, formed through LOCOS, adjoining a drain, whereby said first transistor has a large drain to gate breakdown voltage and rapid ESD switching speeds; and at least a second LOCOS MOS device connected in shunt from the input of the electrical device to be protected, for clamping voltage, said second LOCOS MOS device including a multilevel gate oxide layer with a thin layer of gate oxide adjoining a source, and a thick gate oxide layer, formed through LOCOS, adjoining a drain, whereby the electrical device is protected by multiple stages of voltage conditioning for protection from ESD.

* * * * *